(12) United States Patent
Ershov et al.

(10) Patent No.: US 6,865,210 B2
(45) Date of Patent: Mar. 8, 2005

(54) TIMING CONTROL FOR TWO-CHAMBER GAS DISCHARGE LASER SYSTEM

(75) Inventors: Alexander I. Ershov, San Diego, CA (US); Richard M. Ness, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 121 days.

(21) Appl. No.: 10/036,727

(22) Filed: Dec. 21, 2001

(65) Prior Publication Data

US 2003/0099269 A1 May 29, 2003

Related U.S. Application Data

(63) Continuation-in-part of application No. 10/012,002, filed on Nov. 30, 2001, now Pat. No. 6,625,191, which is a continuation-in-part of application No. 09/943,343, filed on Aug. 29, 2001, now Pat. No. 6,567,450, which is a continuation-in-part of application No. 09/848,043, filed on May 3, 2001, now Pat. No. 6,549,551.

(51) Int. Cl.[7] ............................................. H01S 3/22
(52) U.S. Cl. ............................. 372/55; 372/25; 372/30; 372/6; 372/56; 372/57; 372/58; 372/59
(58) Field of Search ............................. 372/25, 30, 6, 372/55–59

(56) References Cited

U.S. PATENT DOCUMENTS

| | | | |
|---|---|---|---|
| 4,223,279 A | 9/1980 | Bradford, Jr. et al. | 331/94.5 |
| 4,455,658 A | 6/1984 | Sutter et al. | 372/38 |
| 4,550,408 A | 10/1985 | Karning et al. | 372/58 |
| 4,891,820 A | 1/1990 | Rando et al. | 372/93 |
| 4,959,840 A | 9/1990 | Akins et al. | 372/57 |

(List continued on next page.)

*Primary Examiner*—Don Wong
*Assistant Examiner*—Delma R. Flores-Ruiz
(74) *Attorney, Agent, or Firm*—William Cray

(57) ABSTRACT

Feedback timing control equipment and process for an injection seeded modular gas discharge laser. A preferred embodiment is a system capable of producing high quality pulsed laser beams at pulse rates of about 4,000 Hz or greater and at pulse energies of about 5 to 10 mJ or greater for integrated outputs of about 20 to 40 Watts or greater. The feedback timing control is programmed to permit in some circumstances discharges timed so that no significant laser energy is output from the system. Use of this technique permits burst mode operation in which the first discharge of a burst is a no-output discharge so that timing parameters for each of the two chambers can be monitored before the first laser output pulse of the burst. Two separate discharge chambers are provided, one of which is a part of a master oscillator producing a very narrow band seed beam which is amplified in the second discharge chamber. The chambers can be controlled separately permitting optimization of wavelength parameters in the master oscillator and optimization of pulse energy parameters in the amplifying chamber.

26 Claims, 17 Drawing Sheets

FIG.1A

U.S. PATENT DOCUMENTS

| | | | |
|---|---|---|---|
| 5,005,180 A | 4/1991 | Edelman et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,852,621 A | 12/1998 | Sandstrom | 372/25 |
| 5,863,017 A | 1/1999 | Larson et al. | 248/176.1 |
| 5,953,360 A | 9/1999 | Vitruk et al. | 372/87 |
| 5,978,394 A | 11/1999 | Newman et al. | 372/32 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,067,306 A * | 5/2000 | Sandstrom et al. | 372/38.01 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 8,281,471 * | 8/2001 | Smart | 219/121.62 |
| 6,381,257 B1 | 4/2002 | Ershov et al. | 372/57 |
| 6,414,979 B2 | 7/2002 | Ujazdowski et al. | 372/87 |
| 6,477,193 B2 | 11/2002 | Oliver et al. | 372/58 |
| 6,711,187 B2 * | 3/2004 | Grapov et al. | 372/30 |
| 2002/0021728 A1 | 2/2002 | Newman et al. | 372/55 |
| 2002/0154668 A1 * | 10/2002 | Knowles et al. | 372/55 |
| 2002/0162973 A1 * | 11/2002 | Cordingley et al. | 250/492.2 |
| 2003/0099269 A1 * | 5/2003 | Ershov et al. | 372/55 |

\* cited by examiner

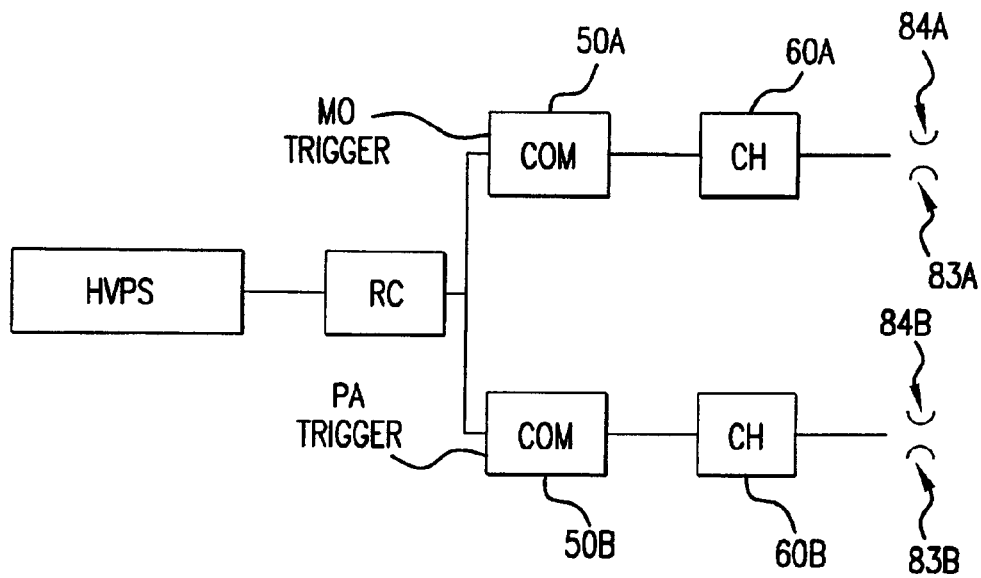
FIG.3C1
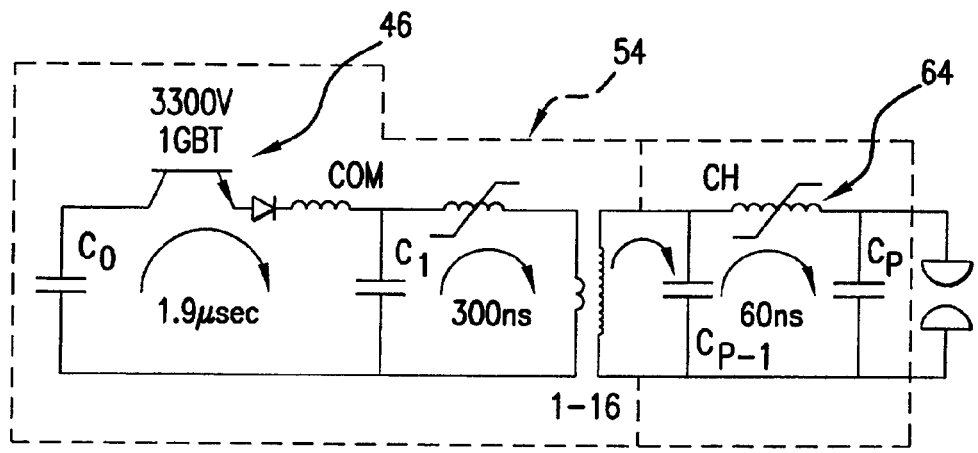
FIG.3C2
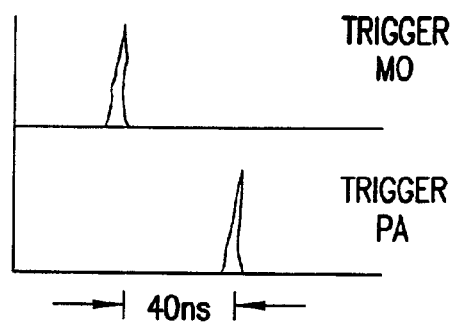
FIG.3C3

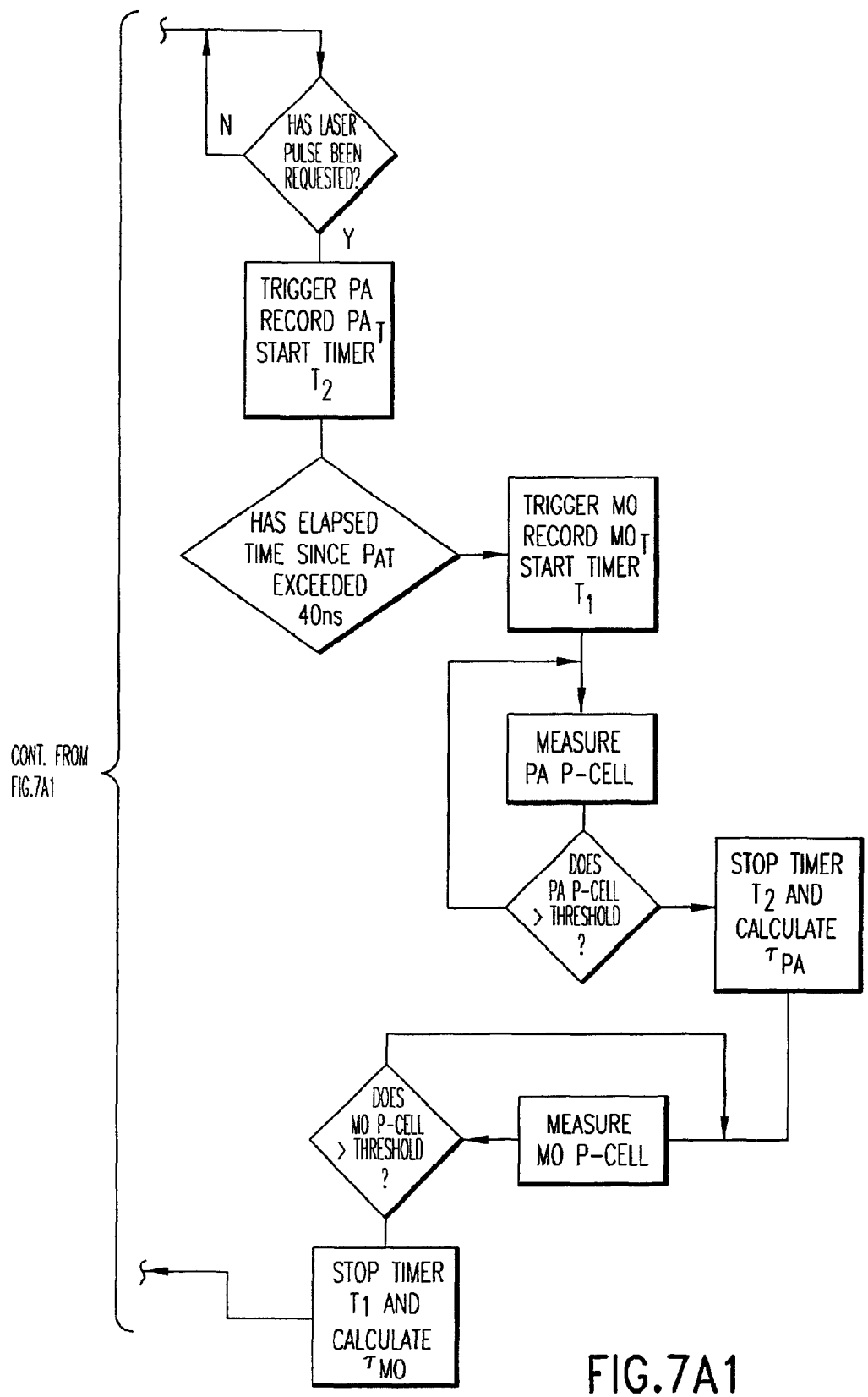
FIG.7A1

TIMING CONTROL FOR TWO-CHAMBER GAS DISCHARGE LASER SYSTEM

The present invention is a continuation-in-part of Ser. No. 10/012,002 filed Nov. 30, 2001, now U.S. Pat. No. 6,625,191 Ser. No. 09/943,343, filed Aug. 29, 2001 now U.S. Pat. No. 6,567,450 and Ser. No. 09/848,043, filed May 3, 2001, now U.S. Pat. No. 6,549,551 each of which are incorporated by reference herein. This invention relates to narrow band two chamber gas discharge laser system and in particular to discharge timing control for such systems.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants'employer, and the patent is hereby incorporated herein by reference. The excimer laser described in patent '884 is a high repetition rate pulse laser. These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP") which forms the back of the laser's resonant cavity. This LNP is comprised of delicate optical elements including prisms, mirrors and a grating. Electric discharge gas lasers of the type described in patent '884 utilize an electric pulse power system to produce the electrical discharges, between the two electrodes. In such prior art systems, a direct current power supply charges a capacitor bank called "the charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances In Lithography Light Sources

Excimer lasers such as described in the '884 patent have during the period 1989 to 2001 become the primary light source for integrated circuit lithography. More than 1000 of these lasers are currently in use in the most modern integrated circuit fabrication plants. Almost all of these lasers have the basic design features described in the '884 patent. This is:

(1) a single, pulse power system for providing electrical pulses across the electrodes at pulse rates of about 100 to 2500 pulses per second;
(2) a single resonant cavity comprised of a partially reflecting mirrortype output coupler and a line narrowing unit consisting of a prism beam expander, a tuning mirror and a grating;
(3) a single discharge chamber containing a laser gas (either KrF or ArF), two elongated electrodes and a tangential fan for circulating the laser gas between the two electrodes fast enough to clear the discharge region between pulses, and
(4) a beam monitor for monitoring pulse energy, wavelength and bandwidth of output pulses with a feedback control system for controlling pulse energy, energy dose and wavelength on a pulse-to-pulse basis.

During the 1989–2001 period, output power of these lasers has increased gradually and beam quality specifications for pulse energy stability, wavelength stability and bandwidth have also become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm (FWHM) and pulse energy stability at +/−0.35%.

There is a need for further improvements in these beam parameters. Integrated circuit fabricators desire better control over wavelength, bandwidth, higher beam power with more precise control over pulse energy. Some improvements can be provided with the basic design as described in the '884 patent; however, major improvements with that basic design may not be feasible. For example, with a single discharge chamber precise control of pulse energy may adversely affect wavelength and/or bandwidth and vice versa especially at very high pulse repetition rates.

Injection Seeding

A well-known technique for reducing the band-width of gas discharge laser systems (including excimer laser systems) involves the injection of a narrow band "seed" beam into a gain medium. In one such system, a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated than comparable single chamber laser systems. Therefore, commercial application of these two chamber laser systems has been limited.

Jitter Problems

In gas discharge lasers of the type referred to above, the duration of the electric discharge is very short duration, typically about 20 to 50 ns (20 to 50 billions of a second). Furthermore, the population inversion created by the discharge is very rapidly depleted so that the population inversion effectively exists only during the discharge. In these two laser systems, the population in the downstream laser must be inverted when the beam from the upstream laser reaches the second laser. Therefore, the discharges of the two lasers must be appropriately synchronized for proper operation of the laser system. This can be a problem because within typical pulse power systems there are several potential causes of variation in the timing of the discharges. Two of the most important sources of timing variations are voltage variations and temperature variations in saturable inductors used in the pulse power circuits. It is known to monitor the pulse power charging voltage and inductor temperatures and to utilize the data from the measurements and a delay circuit to normalize timing of the discharge to desired values. One prior art example is described in U.S. Pat. No. 6,016,325 which is incorporated herein by reference. Thus in the prior art, timing errors can be reduced but they could not be eliminated. These errors that ultimately result are referred to as "jitter".

When a two chamber laser system is operating continuously the jitter problem can be dealt with by measuring the time between trigger and light out for each chamber and by providing feedback signals for subsequent pulses based on measured timing values for previous pulses such as the immediately preceding pulse. This technique does not work well; however, for the first pulse following an idle period because the temperature of electrical components tend to drift during idle periods changing the timing characteristics of the components.

What is needed is a better method of dealing with the jitter problem.

SUMMARY OF THE INVENTION

The present invention provides feedback timing control equipment and process for an injection seeded modular gas discharge laser. A preferred embodiment is a system capable of producing high quality pulsed laser beams at pulse rates of about 4,000 Hz or greater and at pulse energies of about 5 to 10 mJ or greater for integrated outputs of about 20 to 40 Watts or greater. The feedback timing control is programmed to permit in some circumstances discharges timed so that no significant laser energy is output from the system. Use of this technique permits burst mode operation in which the first discharge of a burst is a no-output discharge so that timing parameters for each of the two chambers can be monitored before the first laser output pulse of the burst. Two separate discharge chambers are provided, one of which is a part of a master oscillator producing a very narrow band seed beam which is amplified in the second discharge chamber. The chambers can be controlled separately permitting optimization of wavelength parameters in the master oscillator and optimization of pulse energy parameters in the amplifying chamber. A preferred embodiment is an ArF excimer laser system configured as a MOPA and specifically designed for use as a light source for integrated circuit lithography. In this preferred embodiment, both of the chambers and the laser optics are mounted on a vertical optical table within a laser enclosure. In the preferred MOPA embodiment, each chamber comprises a single tangential fan providing sufficient gas flow to permit operation at pulse rates of 4000 Hz or greater by clearing debris from the discharge region in less time than the approximately 0.25 milliseconds between pulses. The master oscillator is equipped with a line narrowing package having a very fast tuning mirror capable of controlling centerline wavelength on a pulse-to-pulse basis at repetition rates of 4000 Hz or greater and providing a bandwidth of less than 0.2 pm (FWHM). This preferred embodiment also includes a pulse multiplying module dividing each pulse from the power amplifier into either two or four pulses in order to reduce substantially deterioration rates of lithography optics. Other preferred embodiments are configured as KrF or $F_2$ MOPA laser systems.

BRIEF DESCRIPTION OF THE DRAWINGS

FIGS. 1 and 1A show a preferred embodiment of the present invention.

FIGS. 3A, 3B, 3C1, 3C2, 3C3 and 3D show additional pulse power features.

DETAILED DESCRIPTION OF PREFERRED EMBODIMENTS

Preferred embodiments of the present invention can be described by reference to the drawings.

Preferred Layout

Figure 1:
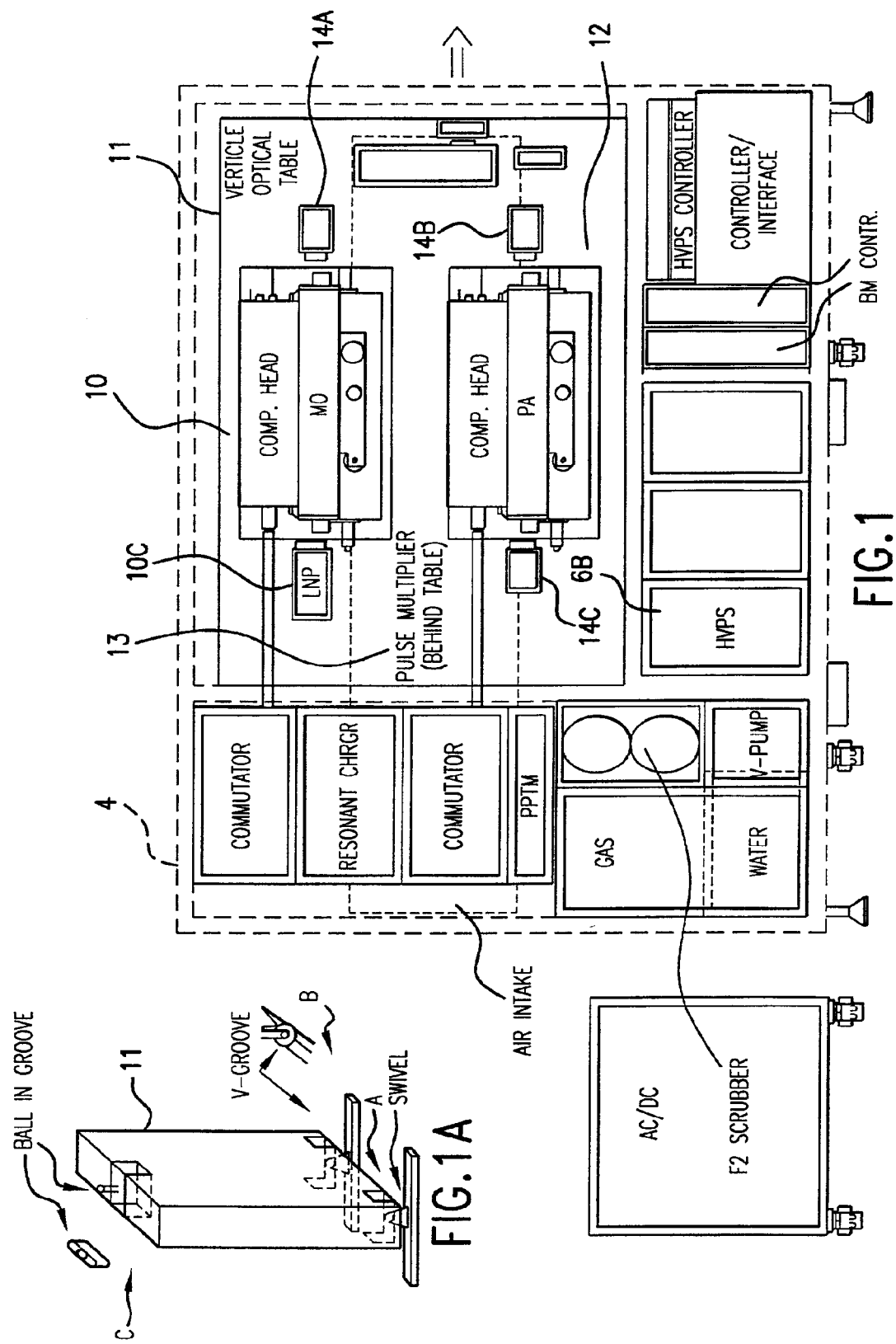

FIG. 1 is a preferred general layout of a two-chamber ArF discharge laser system configured as a master oscillator power amplifier (MOPA) system. The system includes the following features which are described in much more detail in U.S. patent application Ser. No. 10/012,002 filed Nov. 30, 2001. Features included are:

(1) The two chambers and the laser optics are mounted on a vertical optical table 11 which is kinematically mounted within the laser cabinet 4. The chambers are supported on stiff cantilever arms bolted to the optical table. In this design the master oscillator 10 is mounted above the power amplifier 12.

(2) A high voltage power supply 6B is contained within laser cabinet 4. This two chamber-ArF 4000 Hz system needs only a single 1200 volt power supply. The same is true for a 4000 Hz KrF system. The laser cabinet, however, is provided with space for two additional high voltage power supplies which will be needed for a two chamber, 6000 Hz, $F_2$ laser system. One additional HVPS will be utilized for a 6000 Hz ArF system.

(3) Each of the two laser chambers and the pulse power supplies for the chambers are substantially identical to the chamber and pulse power supply utilized in a 4000 Hz single chamber laser system described U.S. patent application Ser. No. 09/854,097 which has been incorporated herein by reference.

(4) A pulse multiplier module 13 located behind the optical table 11 is included in this embodiment to stretch the duration of the pulse exiting the power amplifier.

(5) The master oscillator beam output optics 14A directs the output beam from the MO to the power amplifier input-output optics 14B and for two passes through the power amplifier 12 via power amplifier rear optics 14C. The first pass is at a small angle with the electrodes and the second pass is aligned with the electrodes. The entire beam path through the laser system including the pulse stretcher is enclosed in vacuum compatible enclosures (not shown) and the enclosures are purged with nitrogen or helium.

The Master Oscillator

Figure 2:
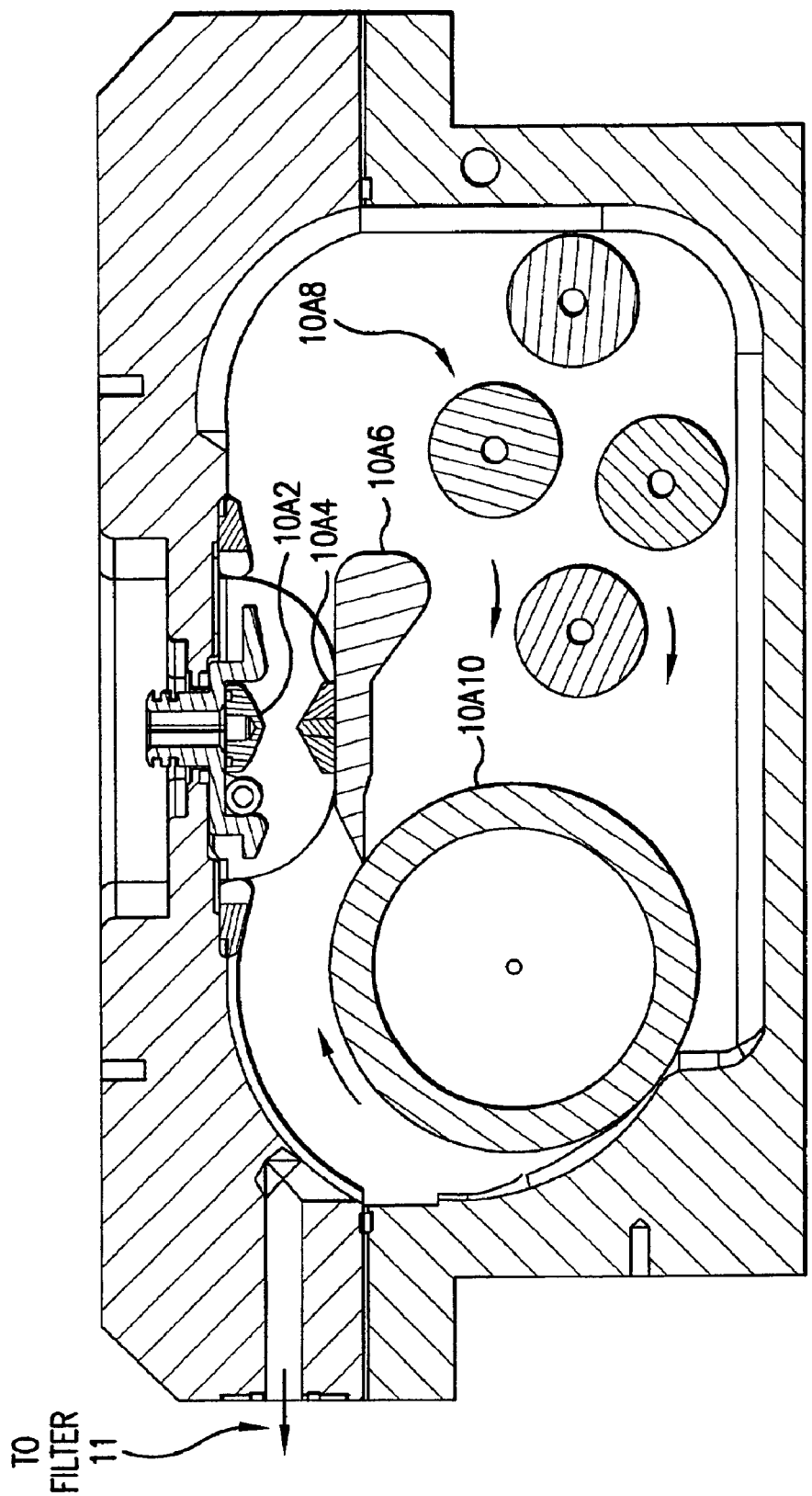
FIGS. 2 and 2A show chamber features.
Figure 2A:
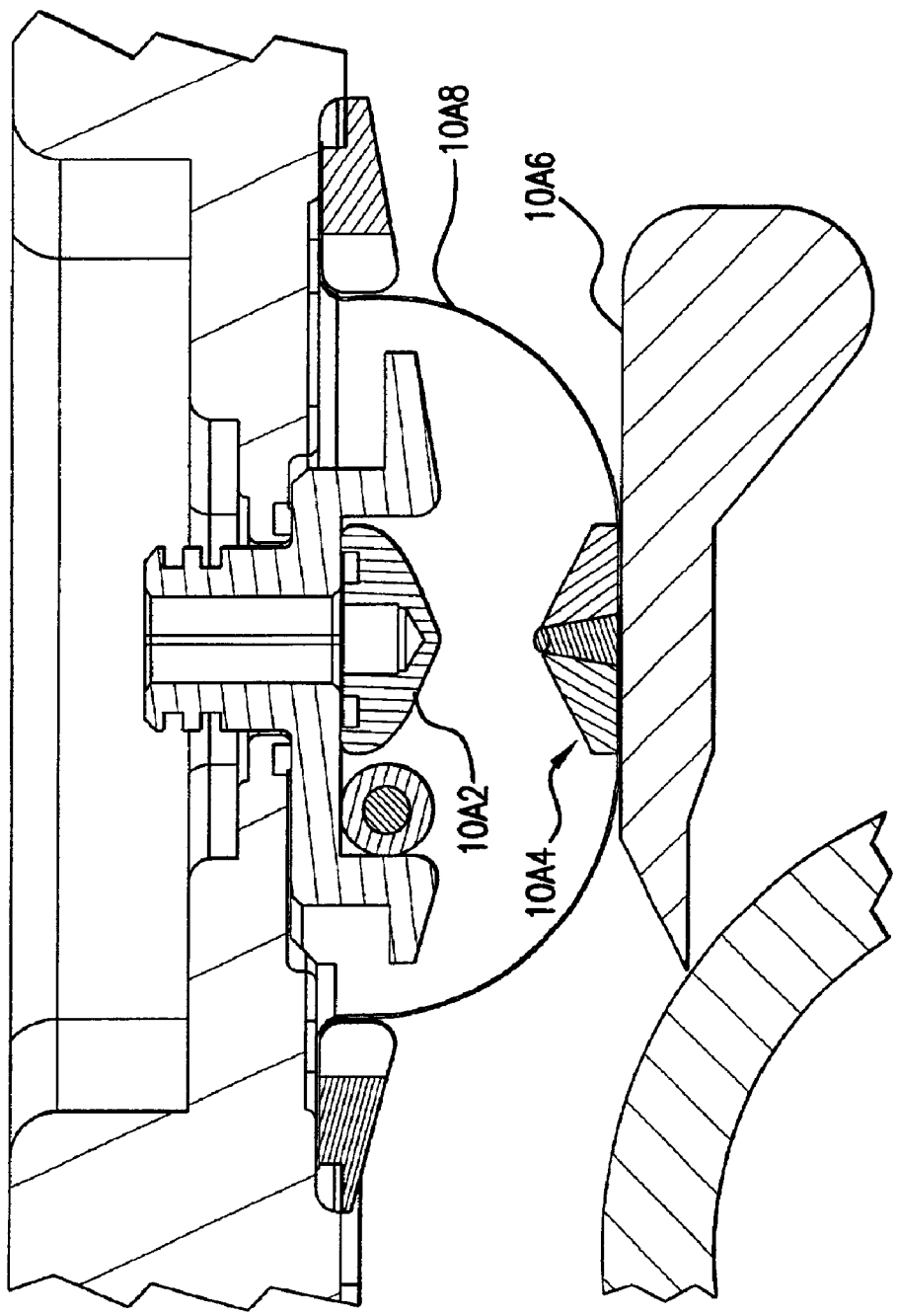

The master oscillator 10 shown in FIG. 1 is in many ways similar to prior art ArF lasers such as described in the '884 patent and in U.S. Pat. No. 6,128,323 and is substantially equivalent to the ArF laser described in U.S. patent application Ser. No. 09/854,097 except the output pulse energy is about 0.1 mJ instead of about 5 mJ. Major improvements over the '323 laser are provided to permit operation at 4000 Hz and greater. The master oscillator is optimized for spectral performance including bandwidth control. This result is a much more narrow bandwidth and improved bandwidth stability. The master oscillator comprises discharge chamber as shown in FIG. 2 and FIG. 2A in which are located a pair of elongated electrodes 10A-2 and 10A-4, each about 50 cm long and spaced apart by about 0.5 inch. Anode 10A-4 is mounted on flow shaping anode support bar 10A-6. Four separate finned water cooled heat exchanger units 10A-8 are provided. A tangential fan 10A-10 is driven by two motors (not shown) for providing a laser gas flow at a velocity of about 80 m/s between the electrodes. The chamber includes window units (not shown) with $CaF_2$ windows positioned at about 45° with the laser beam. An electrostatic filter unit having an intake at the center of the chamber, filters a small portion of the gas flow as indicated at 11 in FIG. 2 and the cleaned gas is directed into window units in the manner described in U.S. Pat. No. 5,359,620 (incorporated herein by reference) to keep discharge debris away from the windows. The gain region of the master oscillator is created by discharges between the electrodes through the laser gas which in this embodiment is comprised of about 3% argon, 0.1% $F_2$ and the rest neon. The gas flow clears the debris of each discharge from the discharge region prior to the next pulse. The resonant cavity is created at the output side by an output coupler which is comprised of a $CaF_2$ mirror mounted perpendicular to the beam direction and coated to reflect about 30% of light at 193 nm and to pass about 70% of the 193 nm light. The opposite boundary of the resonant cavity is a line narrowing unit 10C as shown in FIG. 1 similar to prior art line narrowing units described in U.S. Pat. No. 6,128,323. The LNP is described in more detail below as in FIGS. 16, 16A, 16B1 and 16B2. Important improvements in this line narrowing package include four CaF beam expanding prisms for expanding the beam in the horizontal direction by 45 times and a tuning mirror controlled by a stepper motor for relatively large pivots and a piezoelectric driver for providing extremely fine tuning of the mirror. Echelle grating 10C3 having about 80 facets per mm is mounted in the Litrow configuration reflects a very narrow band of UV light selected from the approximately 300 pm wide ArF natural spectrum. Preferably the master oscillator is operated at a much lower F2 concentration than is typicaly used in prior art lithography light sources. This results in substantial reductions in the bandwidth. Another important improvement is a narrow rear aperture which limits the cross section of the oscillator beam to 1.1 mm in the horizontal direction and 7 mm in the vertical direction.

In preferred embodiments the main charging capacitor banks for both the master Gil, oscillator and the power amplifier are charged in parallel so as to reduce jitter problems. This is desirable because the time for pulse compression in the pulse compression circuits of the two pulse power systems is dependent on the level of the charge of the charging capacitors. Preferably pulse energy output is controlled on a pulse-to-pulse basis by adjustment of the charging voltage. This limits somewhat the use of voltage to control beam parameters of the master oscillator. However, laser gas pressure and $F_2$ concentration can be easily controlled to achieve desirable beam parameters over a wide range pulse energy increases and laser gas pressure. Bandwidth decreases with $F_2$ concentration and laser gas pressure. These control features are in addition to the LNP controls. (For the master oscillator the time between discharge and light-out is a function of $F_2$ concentration (1 ns/kPa), so $F_2$ concentration may be changed to vary the timing.)

Power Amplifier

The power amplifier in preferred embodiments is comprised of a laser chamber which is very similar to the corresponding master oscillator discharge chamber. Having the two separate chambers allows the pulse energy and integrated energy in a series of pulses (called dose) to be controlled, to a large extent, separately from wavelength and bandwidth. This permits better dose stability. All of the components of the chamber are the same and are interchangeable during the manufacturing process. However, in operation, the gas pressure is preferably substantially lower in the MO as compared to the PA. The compression head of the power amplifier is also substantially identical in this embodiment to the compression head and the components of the compression head are also interchangeable during manufacture. One difference is that the capacitors of the compression head capacitor bank are more widely positioned for the MO to produce a substantially higher inductance as compared to the PA. This close identity of the chambers and the electrical components of the pulse power systems helps assure that the timing characteristics of the pulse forming circuits are the same or substantially the same so that jitter problems are minimized.

The power amplifier is configured for two beam passages through the discharge region of the power amplifier discharge chamber. The charging voltages preferably are selected on a pulse-to-pulse basis to maintain desired pulse and dose energies. $F_2$ concentration and laser gas pressure can be adjusted to provide a desired operating range of charging voltage. This desired range can be selected to produce a desired value of dE/dV since the change in energy with voltage is a function of $F_2$ concentration and laser gas pressure. The timing of injections is preferable based on charging voltage. The frequency of injections is preferably high to keep conditions relatively constant and can be continuous or nearly continuous. Some users of these embodiments may prefer larger durations (such as 2 hours) between $F_2$ injections.

Pulse Power Circuit

Figure 3A:
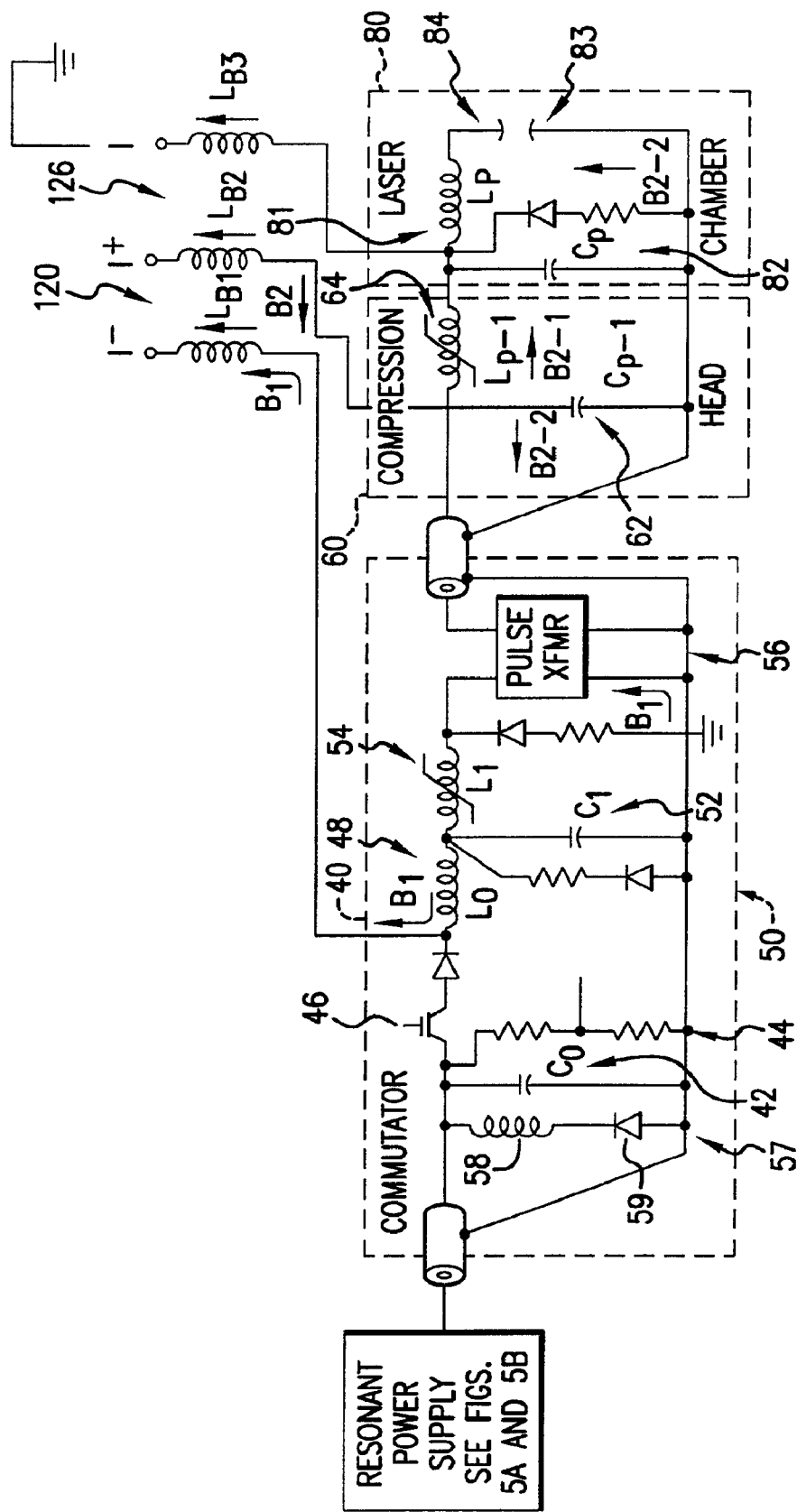
Figure 3B:
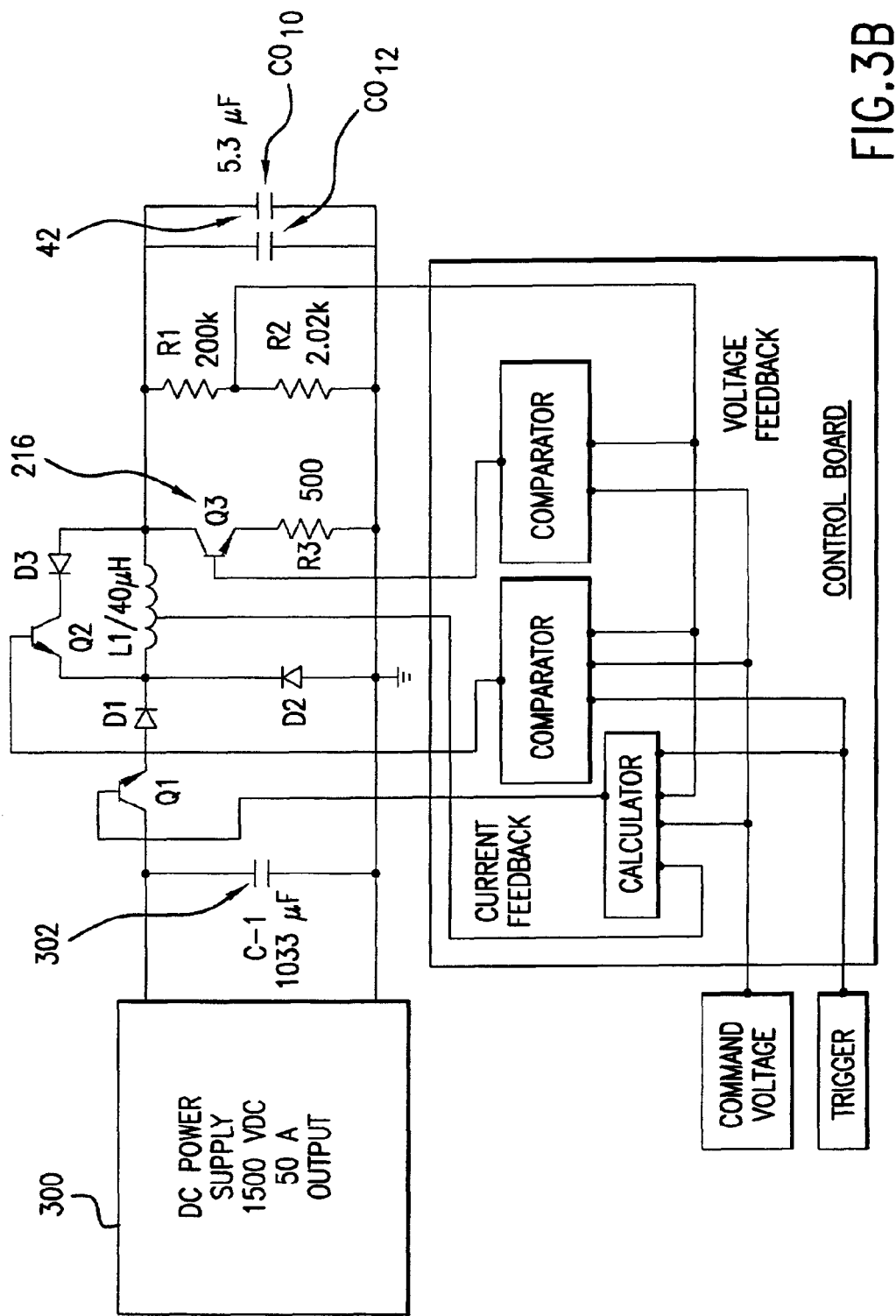
Figure 3D:
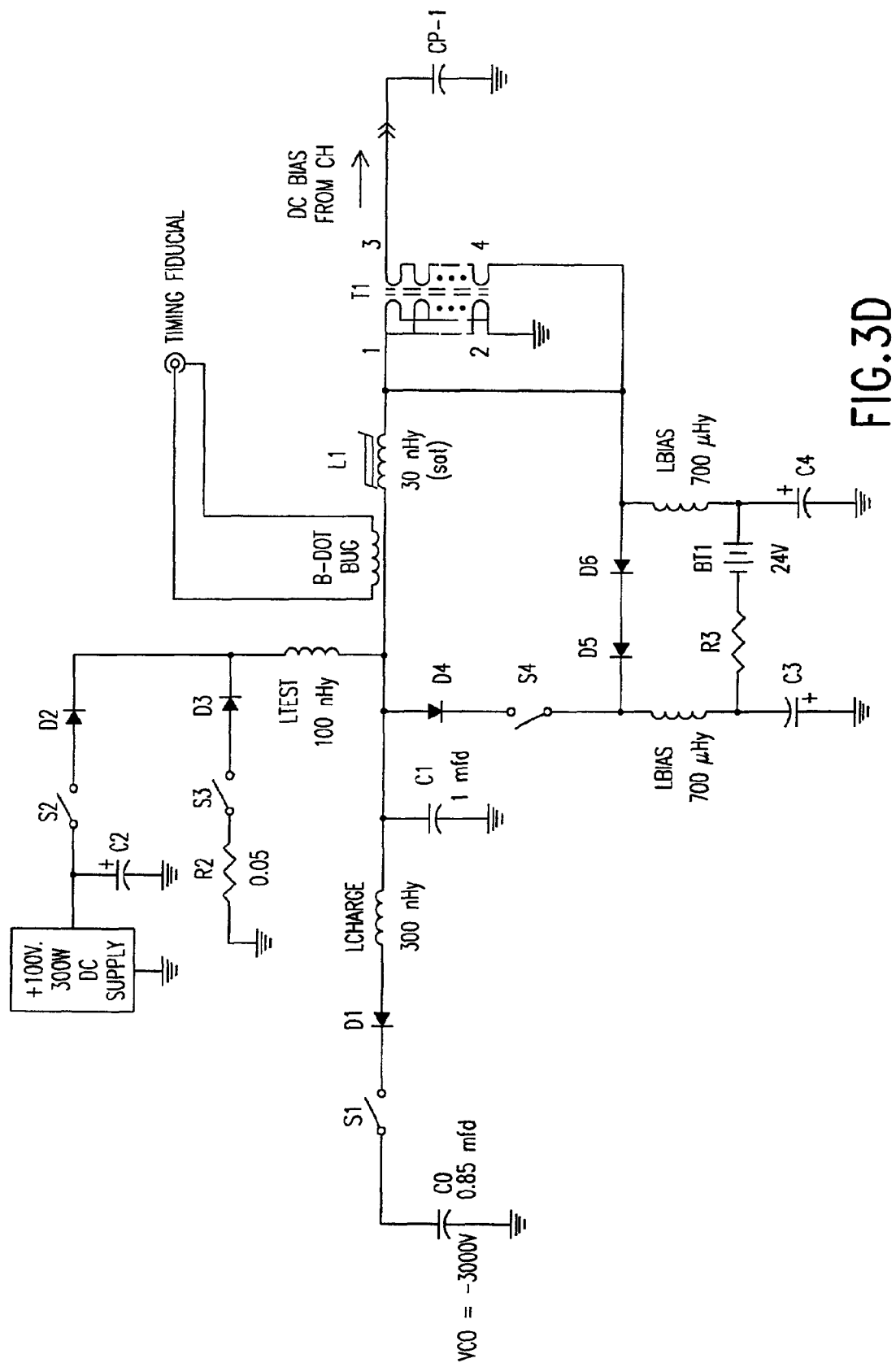

In the preferred embodiment shown in FIG. 1, the basic pulse power circuits are similar to pulse power circuits of prior art excimer laser light sources for lithography. However, separate pulse power circuits downstream of the charging capacitors are provided for each discharge chamber. Preferably a single resonant charger charges two charging capacitor banks connected in parallel to assure that both charging capacitor banks are charged to precisely the same voltage. Important improvements are also provided to regulate the temperature of components of the pulse power circuits. In preferred embodiments the temperatures of the magnetic cores of saturable inductors are monitored and the temperature signals are utilized in a feedback circuit to adjust the relative timing of the discharge in the two chambers. FIGS. 3A and 3B show important elements of a preferred basic pulse power circuit which is used for the MO. The same basic circuit is also used for the PA.

Resonant Charger

A preferred resonant charger system is shown in FIG. 3B. The principal circuit elements are:

I1—A three-phase power supply 300 with a constant DC current output.

C-1—A source capacitor 302 that is an order of magnitude or more larger than the $C_0$ capacitor 42 shown in FIG. 3A.

Q1, Q2, and Q3—Switches to control current flow for charging and maintaining a regulated voltage on $C_0$.

D1, D2, and D3—Provides current single direction flow.

R1, and R2—Provides voltage feedback to the control circuitry.

R3—Allows for rapid discharge of the voltage on $C_0$ in the event of a small over charge.

L1—Resonant inductor between C-1 capacitor 302 and $C_0$ capacitor banks 42 to limit current flow and setup charge transfer timing.

Control Board 304—Commands Q1, Q2, and Q3 open and closed based upon circuit feedback parameters.

This circuit includes switch Q2 and diode D3, together known as a De-Qing switch. This switch improves the regulation of the circuit by allowing the control unit to short out the inductor during the resonant charging process. This "de-qing" prevents additional energy stored in the current of the charging inductor, L1, from being transferred to capacitor $C_0$.

Prior to the need for a laser pulse, the voltage on C-1 is charged to about 1500 volts and switches Q1–Q3 are open. Upon command from the laser, Q1 would close. At this time current would flow from C-1 to $C_0$ through the charge inductor L1. As described in the previous section, a calculator on the control board would evaluate the voltage on $C_0$ and the current flowing in L1 relative to a command voltage set point from the laser. Q1 will open when the voltage on the CO capacitor banks plus the equivalent energy stored in inductor L1 equals the desired command voltage. The calculation is:

$$V_f = [V_{Cos}^2 + ((L_1 * I_{L1s}^2)/C_0)]^{0.5}$$

Where:

$V_f$=The voltage on $C_0$ after Q1 opens and the current in L1 goes to zero.

$V_{Cos}$=The voltage on $C_O$ when Q1 opens.

$I_{L1s}$=The current flowing through $L_1$ when Q1 opens.

After Q1 opens the energy stored in L1 starts transferring to the CO capacitor banks through D2 until the voltage on the CO capacitor banks approximately equals the command voltage. At this time Q2 closes and current stops flowing to CO and is directed through D3. In addition to the "de-qing" circuit, Q3 and R3 from a bleed-down circuit allow additional fine regulation of the voltage on CO.

Switch Q3 of bleed down circuit 216 will be commanded closed by the control board when current flowing through inductor L1 stops and the voltage on $C_0$ will be bled down to the desired control voltage; then switch Q3 is opened. The time constant of capacitor $C_0$ and resistor R3 should be sufficiently fast to bleed down capacitor $C_O$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on the CO capacitor banks nears the target value, the de-qing switch is closed, stopping the resonant charging when the voltage on $C_O$ is at or slightly above the target value. In a preferred embodiment, the switch Q1 and the de-qing switch is used to provide regulation with accuracy better than +/−0.1%. If additional regulation is required, the third control over the voltage regulation could be utilized. This is the bleed-down circuit of switch Q3 and R3 (shown at 216 in FIG. 5B) to discharge the CO's down to the precise target value.

Improvements Downstream of the CO's

As indicated above, the pulse power system of the MO and the PA of the present invention each utilizes the same basic pulse power design (FIG. 3A) as was used in the prior art systems. However, changes were required for the approximate factor of 3 increase in heat load resulting from the greatly increased repetition rate.

Detailed Commutator and Compression Head Description

In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similiar to those used in prior systems as described in U.S. Pat. Nos. 5,448,580 and 5,315,611. side of the $C_1$ capacitor bank 52.

one of the induction units of the 1:25 step up pulse transformer 56. The housing 545 is connected to the ground lead of unit 56.

Capacitors

Figure 5:
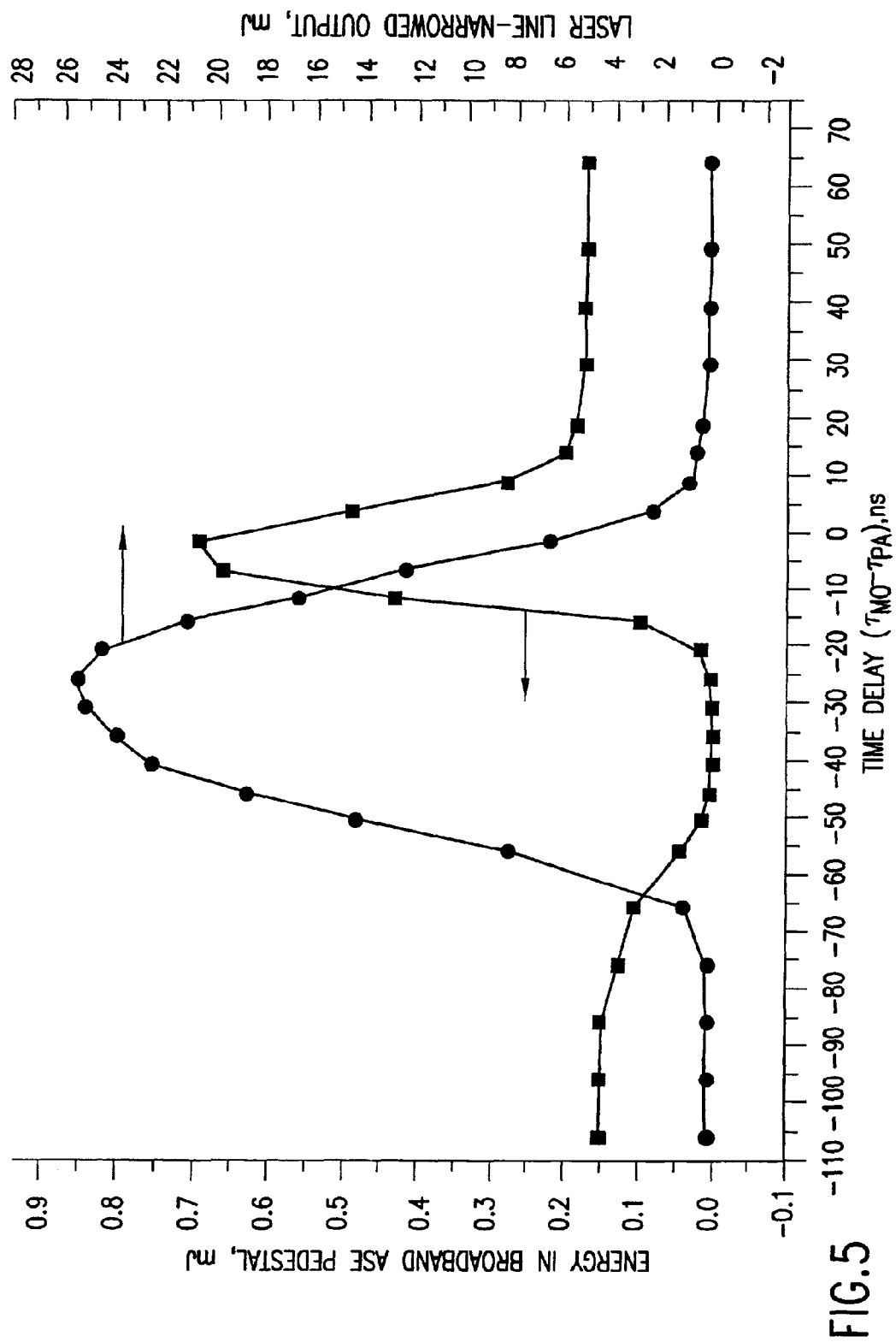
FIG. 5 shows laser output energy as a function of discharge timing of a MO and a PA.

Capacitor banks 42, 52, 62 and 82 (i.e., $C_O$, $C_1$, $C_{p-1}$ and $C_p$) as shown in FIG. 5 are all comprised of banks of off-the-shelf capacitors connected in parallel. Capacitors 42 and 52 are film type capacitors available from suppliers such as Vishay Roederstein with offices in Statesville, N.C. or Wima of Germany. Capacitor bank 62 and 64 is typically composed of a parallel array of high voltage ceramic capacitors from vendors such as Murata or TDK, both of Japan. In a preferred embodiment for use on this ArF laser, capacitor bank 82 (i.e., $C_p$) comprised of a bank of thirty three 0.3 nF capacitors for a capacitance of 9.9 nF; $C_{p-1}$ is comprised of a bank of twenty four 0.40 nF capacitors for a total capacitance of 9.6 nF; $C_1$ is a 5.7 $\mu$F capacitor bank and $C_O$ is a 5.3 $\mu$F capacitor bank.

Pulse Transformer

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. The secondary of the transformer is a single OD stainless steel rod mounted within a tight fitting insulating tube of PTFE (Teflon®). The transformer provides a step-up ratio of 1:25. Thus, an approximately −1400 volt input pulse will produce an approximately −35,000 volt pulse on the secondary side. This single turn secondary winding design provides very low leakage inductance permitting extremely fast output rise time.

Details of Laser Chamber Electrical Components

The Cp capacitor 82 is comprised of a bank of thirty-three 0.3 nf capacitors mounted on top of the chamber pressure vessel. (Typically an ArF laser is operated with a lasing gas made up of 3.5% argon, 0.1% fluorine, and the remainder neon.) The electrodes are about 28 inches long which are separated by about 0.5 to 1.0 inch preferably about ⅝ inch. Preferred electrodes are described below. In this embodiment, the top electrode is referred to as the cathode and the bottom electrode is connected to ground as indicated in FIG. 5 and is referred to as the anode.

Discharge Timing

In ArF, KrF and $F_2$ electric discharge lasers, the electric discharge lasts only about 50 ns (i.e., 50 billionths of a second). This discharge creates a population inversion necessary for lasing action but the inversion only exists during the time of the discharge. Therefore, an important requirement for an injection seeded ArF, KrF or $F_2$ laser is to assure that the seed beam from the master oscillator passes through discharge region of the power amplifier during the approximately 50 billionth of a second when the population is inverted in the laser gas so that amplification of the seed beam can occur. An important obstacle to precise timing of the discharge is the fact that there is a delay of about 5 microseconds between the time switch 42 (as shown in FIG. 5) is triggered to close and the beginning of the discharge which lasts only about 40–50 ns. It takes this approximately 5 microseconds time interval for the pulse to ring through the circuit between the $C_0$'s and the electrodes. This time interval varies substantially with the magnitude of the charging voltage and with the temperature of the inductors in the circuit.

Nevertheless in the preferred embodiment of the present invention described herein, Applicants have developed electrical pulse power circuits that provide timing control of the discharges of the two discharge chambers within a relative accuracy of less than about 2 ns (i.e., 2 billionths of a second). A block diagram of the two circuits are shown in FIG. 4.

Applicants have conducted tests which show that timing varies with charging voltage by approximately 5–10 ns/volt. This places a stringent requirement on the accuracy and repeatability of the high voltage power supply charging the charging capacitors. For example, if timing control of 5 ns is desired, with a shift sensitivity of 10 ns per volt, then the resolution accuracy would be 0.5 Volts. For a nominal charging voltage of 1000 V, this would require a charging accuracy of 0.05% which is very difficult to achieve especially when the capacitors must be charged to those specific values 4000 times per second.

Figure 4:
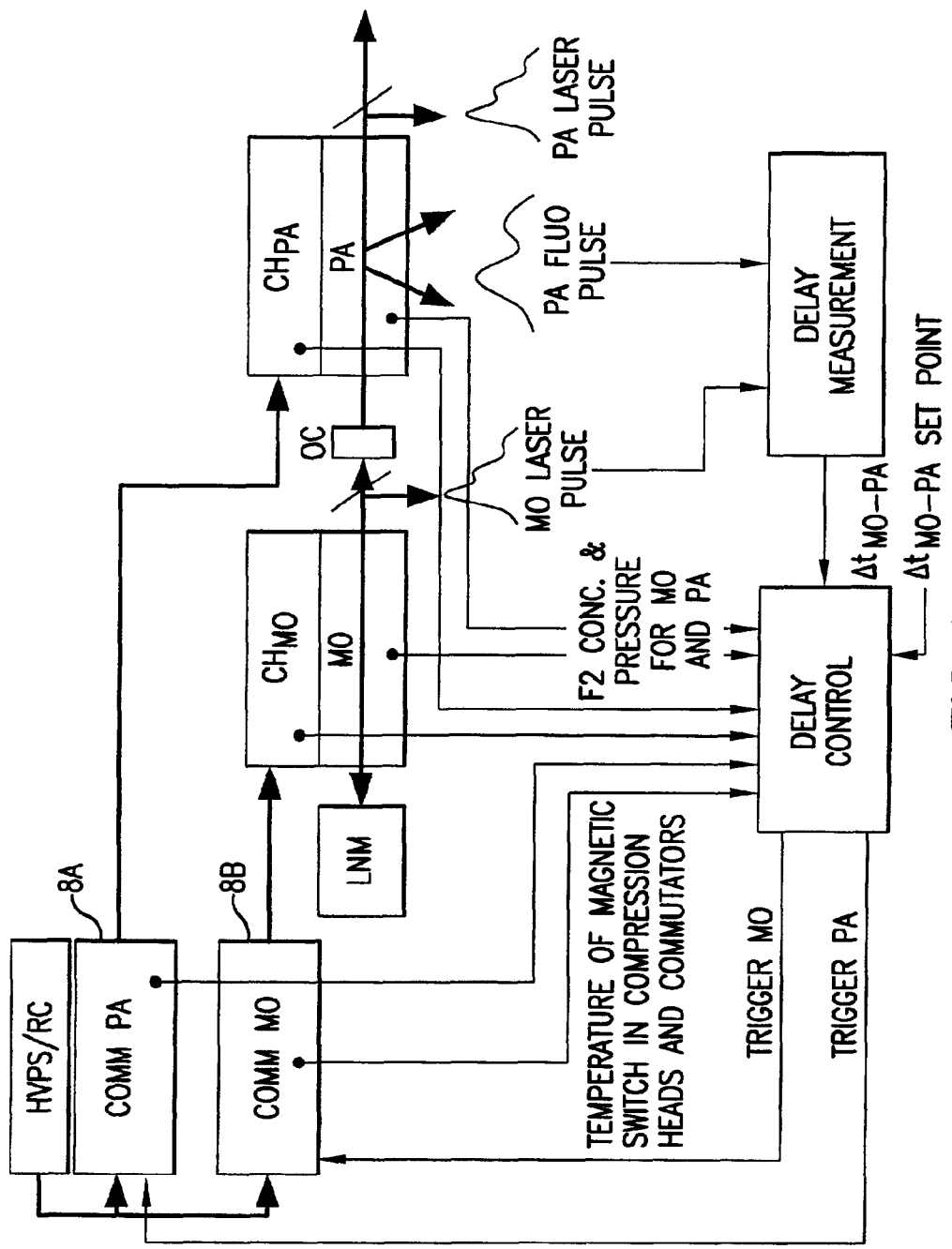
FIGS. 4, 4A, 4B and 4C show features of a preferred pulse power system.
Figure 4A:
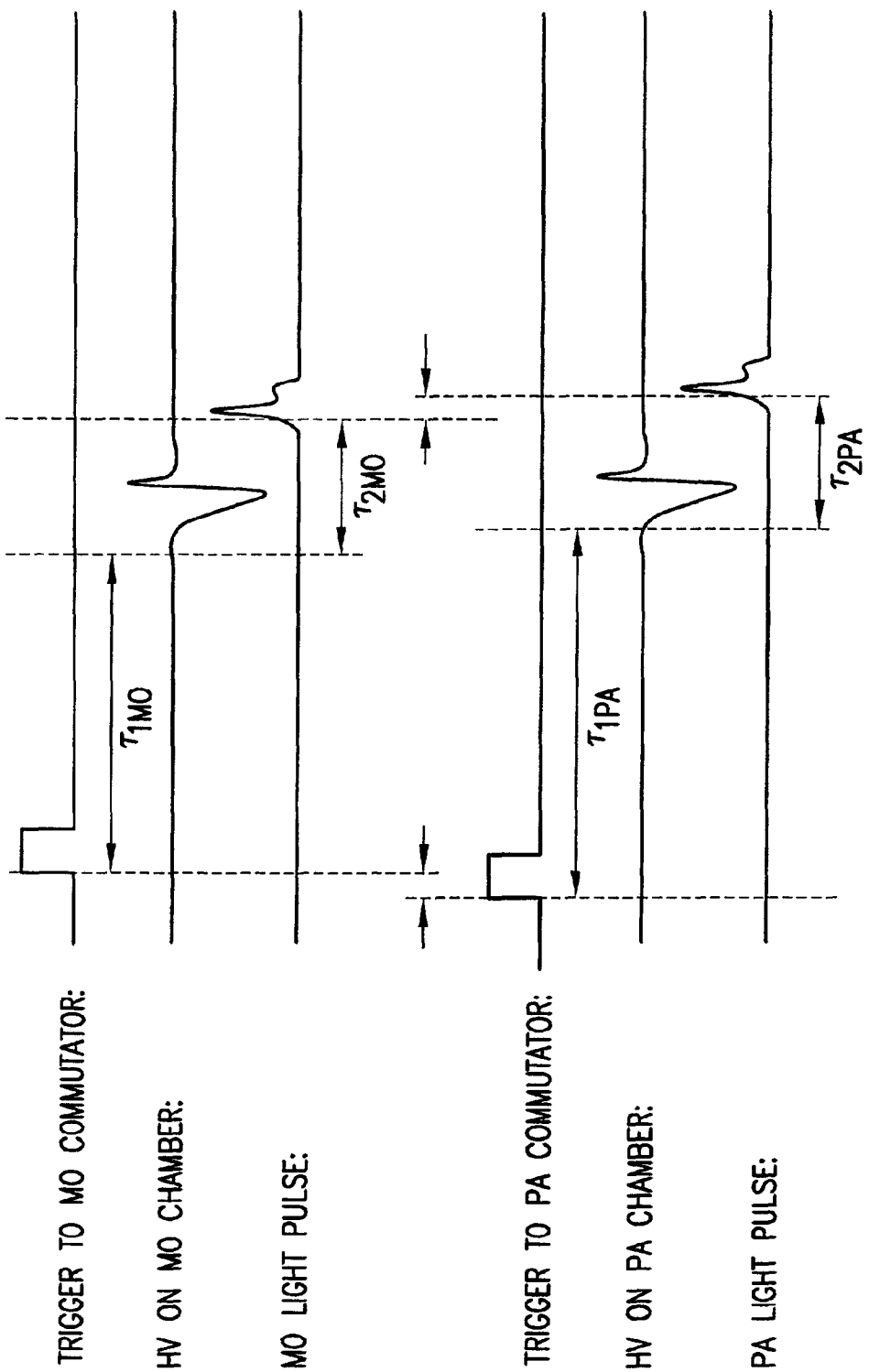
Figure 4B:
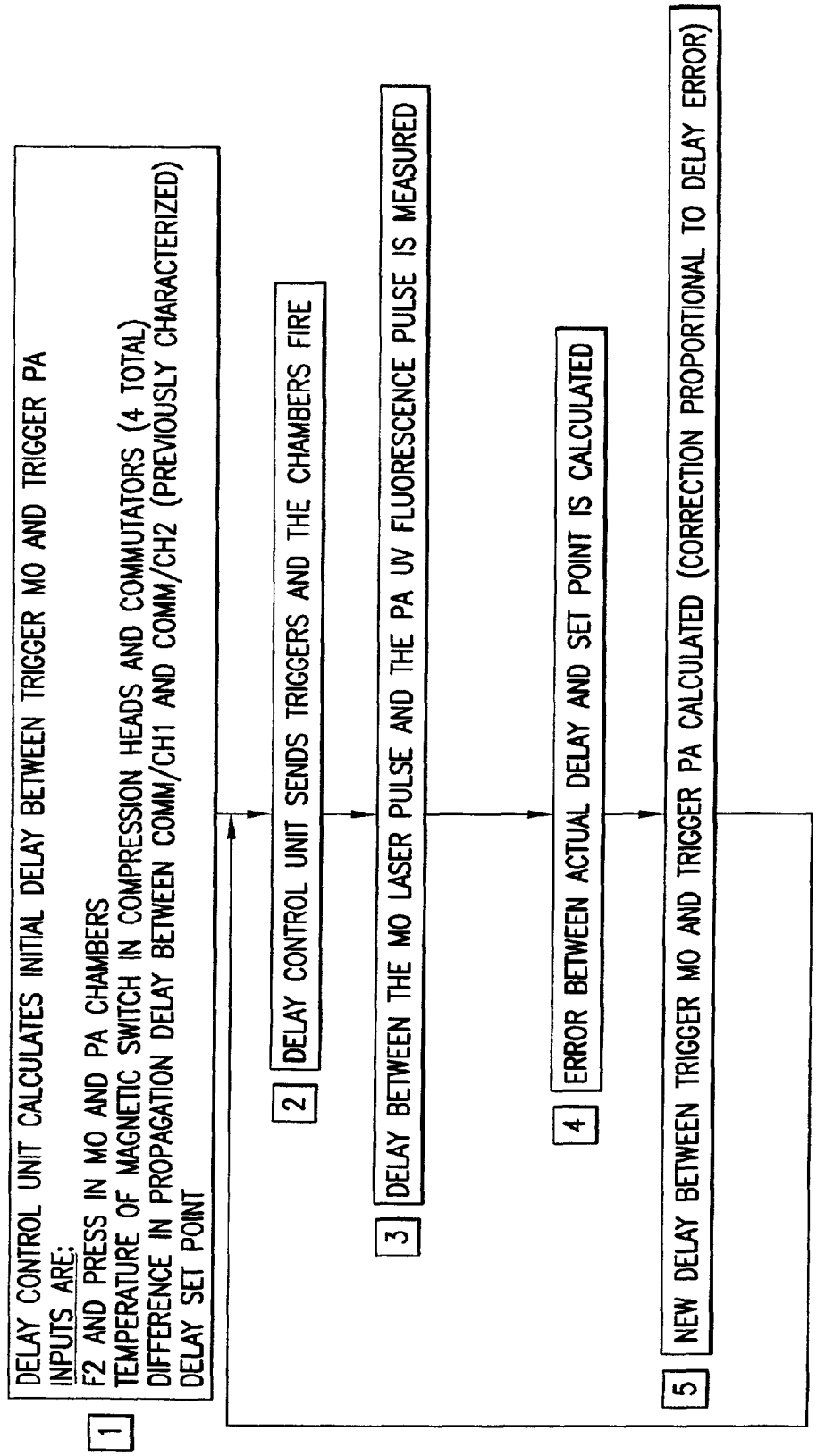
Figure 4C:
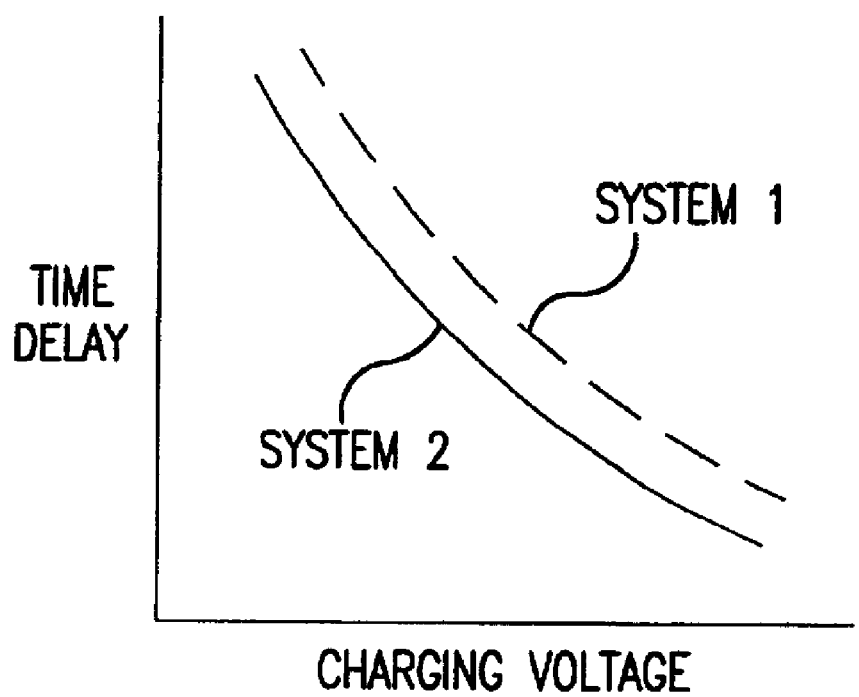

Applicants' preferred solution to this problem is to charge the charging capacitor of both the MO and the PA in parallel from the single resonant charger 7 as indicated in FIG. 1 and FIG. 4 and as described above. It is also important to design the two pulse compression/amplification circuits for the two systems so that time delay versus charging voltage curves match as shown in FIG. 4A. This is done most easily by using to the extent possible the same components in each circuit.

Thus, in order to minimize timing variations (the variations are referred to as jitter) in this preferred embodiment, Applicants have designed pulse power components for both discharge chambers with similar components and have confirmed that the time delay versus voltage curves do in fact track each other as indicated in FIG. 4A. Applicants have confirmed that over the normal operating range of charging voltage, there is a substantial change in time delay with voltage but the change with voltage is virtually the same for both circuits. Thus, with both charging capacitors charged in parallel charging voltages can be varied over a wide operating range without changing the relative timing of the discharges.

Temperature control of electrical components in the pulse power circuit is also important since temperature variations can affect pulse compression timing (especially temperature changes in the saturable inductors). Therefore, a design goal is to minimize temperature variations and a second approach is to monitor temperature of the temperature sensitive components and using a feedback control adjust the trigger timing to compensate. Controls can be provided with a processor programmed with a learning algorithm to make adjustments based on historical data relating to past timing variations with known operating histories. This historical data is then applied to anticipate timing changes based on the current operation of the laser system.

Trigger Control

The triggering of the discharge for each of the two chambers is accomplished separately utilizing for each circuit a trigger circuit such as one of those described in U.S. Pat. No. 6,016,325. These circuits add timing delays to correct for variations in charging voltage and temperature changes in the electrical components of the pulse power so that the time between trigger and discharge is held as constant as feasible. As indicated above, since the two circuits are basically the same, the variations after correction are almost equal (i.e., within about 2 ns of each other).

Techniques to Control Discharge Timing

Since the relative timing of the discharges can have important effects on beam quality additional steps may be justified to control the discharge timing. For example, some modes of laser operation may result in wide swings in charging voltage or wide swings in inductor temperature. These wide swings could complicate discharge timing control.

Monitor Timing

The timing of the discharges can be monitored on a pulse-to-pulse basis and the time difference can be used in a feedback control system to adjust timing of the trigger signals closing switch 42. Preferably, the PA discharge would be monitored using a photocell to observe discharge fluorescence (called ASE) rather than the laser pulse since very poor timing could result if no laser beam being produced in the PA. For the MO either the ASE or the seed laser pulse could be used.

Bias Voltage Adjustment

The pulse timing can be increased or decreased by adjusting the bias currents through inductors $L_{B1}$ $L_{B2}$ and $L_{B3}$ which provide bias for inductors 48, 54 and 64 as shown in FIG. 3A. Other techniques could be used to increase the time needed to saturate these inductors. For example, the core material can be mechanically separated with a very fast responding PZT element which can be feedback controlled based on a feedback signal from a pulse timing monitor.

Adjustable Parasitic Load

An adjustable parasitic load could be added to either or both of the pulse power circuits downstream of the CO's.

Additional Feedback Control

Charging voltage and inductor temperature signals, in addition to the pulse timing monitor signals can be used in feedback controls to adjust the bias voltage or core mechanical separation as indicated above in addition to the adjustment of the trigger timing as described above.

Alternate Pulse Power Circuit

A second preferred pulse power circuit is shown in FIGS. 5C1, 5C2 and 5C3. This circuit is similar to the one described above but utilizes a higher voltage power supply for charging $C_0$ to a higher value. As in the above described embodiments, a high voltage pulse power supply unit operating from factory power at 230 or 460 volts AC, is power source for a fast charging resonant charger as described above and designed for precise charging two 2.17 $\mu$F at frequencies of 4000 to 6000 Hz to voltages in the range of about 1100 V to 2250 V. The electrical components in the commutator and compression head for the master oscillator are as identical as feasible to the corresponding components in the power amplifier. This is done to keep time responses in the two circuits as identical as feasible. Switches 46 are banks of two IGBT switches each rated at 3300 V and arranged in parallel. The $C_0$ capacitor banks 42 is comprised of 128 0.068 $\mu$F 1600 V capacitors arranged in 64 parallel legs to provide the 2.17 $\mu$F $C_0$ bank. The $C_1$ capacitor banks 52 are comprised of 136 0.068 $\mu$F 1600 V capacitors arranged in 68 parallel legs to provide a bank capacitance of 2.33 $\mu$F. The $C_{p-1}$ and $C_p$ capacitor banks are the same as those described above with reference to FIG. 5. The 54 saturable inductors are single turn inductors providing saturated inductance of about 3.3 nH with five cores comprised of 0.5 inch thick 50%—50% Ni—Fe with 4.9 inch OD and 3.8 inch ID. The 64 saturable inductors are two turn inductors providing saturated inductance of about 38 nH each comprised of 5 cores, 0.5 inch thick made with 80%–20% Ni—Fe with an OD of 5 inches and an ID of 2.28 inches. Trigger circuits are provided for closing IGBT's 46 with a timing accuracy of two nanoseconds. The master oscillator is typically triggered about 40 ns prior to the triggering of the IGBT 46 for power amplifier. However, the precise timing is preferably determined by feedback signals from sensors which measure the timing of the output of the master oscillator and the power amplifier discharge.

Alternate Technique For Timing Control

As described earlier, the throughput timing of the magnetic pulse compression in the Pulsed Power system is dependent upon the magnetic material properties that can be a function of the material temperature, etc. In order to maintain precise timing, it is therefore extremely important to either directly or indirectly monitor and/or predict these material properties. One method described previously would utilize temperature monitors along with previously collected data (delay time as a function of temperature) to predict the timing.

An alternate approach would utilize the magnetic switch bias circuit to actually measure the magnetic properties (the saturation time) as the magnetics were reverse biased in between pulses (or prior to the first pulse). The bias circuit would apply sufficient voltage to the magnetic switch to reverse bias the material and at the same time measure the saturation time so that the laser timing could be accurately controlled. Since the volt-second product utilized in reverse biasing the switch should be equal to that required during normal discharge operation in the forward direction, the throughput delay time of the Pulsed Power system could be easily calculated knowing the operating voltage of the upcoming pulse.

A schematic diagram of the proposed approach is shown in FIG. 5D. Initial operation assumes that the magnetic switch, L1, is already saturated in the forward direction, provided by power supply BT1 through the two bias isolation inductors, Lbias, and switch S4. This current is then interrupted by opening S4 and closing S2 which applies ~100 V to the magnetic switch, L1, which then saturates after ~30 us. A timer is triggered when S2 closes and stops counting when a current probe detects saturation of L1, thus calculating the saturation time of L1 for the 100 V applied voltage. L1 is now reverse biased and ready for the main pulse discharge sequence once residual voltage has been drained from the circuit by S3 and other components.

Burst Type Operation

Feedback control of the timing is relatively easy and effective when the laser is operating on a continuous basis. However, normally lithography lasers operate in a burst mode such as the following to process 20 areas on each of many wafers:

Off for 1.2 minutes to move a wafer into place

4000 Hz for 0.2 seconds to illuminate area 1

Off for 0.3 seconds to move to area 2

4000 Hz for 0.2 seconds to illuminate area 2

Off for 0.3 seconds to move to area 3

4000 Hz for 0.2 seconds to illuminate area 3

. . .

4000 Hz for 0.2 seconds to illuminate area 199

Off for 0.3 seconds to move to area 200

4000 Hz for 0.2 seconds to illuminate area 200

Off for one minute to change wafers

4000 Hz for 0.2 seconds to illuminate area 1 on the next wafer, etc.

This process may be repeated for many hours, but will be interrupted from time-to-time for periods longer or shorter than 1.2 minute.

The length of down times will affect the relative timing between the pulse power systems of the MO and the PA and adjustment may be required in the trigger control to assure that the discharge in the PA occurs when the seed beam from the MO is at the desired location. By monitoring the discharges and the timing of light out from each chamber the laser operator can adjust the trigger timing (accurate to within about 2 ns) to achieve best performance.

Preferably a laser control processor is programmed to monitor the timing and beam quality and adjust the timing automatically for best performance. Timing algorithms which develop sets of bin values applicable to various sets of operating modes are utilized in preferred embodiments of this invention. These algorithms are in preferred embodiments designed to switch to a feedback control during continuous operation where the timing values for the current pulse is set based on feedback data collected for one or more preceding pulse (such as the immediately preceding pulse).

No Output Discharge

Timing algorithms such as those discussed above work very well for continuous or regularly repeated operation. However, the accuracy of the timing may not be good in unusual situations such as the first pulse after the laser is off for wafer change or for longer periods such as 5 minutes. In some situations imprecise timing for the first one or two pulses of a burst may not pose a problem. A preferred technique is to preprogram the laser so that the discharges of the MO and the PA are intentionally out of sequence for one or two pulses so that amplification of the seed beam from the MO is impossible. For example, laser could be programmed to trigger the discharge of the PA 110 ns prior to the trigger of the MO. In this case, there will be no significant output from the laser but the laser metrology sensors can determine the timing parameters so that the timing parameters for the first output pulse is precise.

Applicants Test

Applicants have conducted careful experiments to measure the impact of the relative timing of the discharge of the master oscillator and the power amplifier. These tests are summarized in FIG. 5 in which the Applicants have plotted the pulse energy (in millijoules) of amplified stimulated emission (ASE) from the output of the power amplifier and the line narrowed output (also in milliJoules). Both plots are made as a function of delay between the beginning of discharge of the master oscillator and the beginning of discharge of the power amplifier. The reader should note that the energy scale of the ASE is smaller than that for the line narrowed light output.

Lithography customer specifications call for the ASE to be a very small fraction of the line narrowed laser output. A typical specification calls for the ASE to be less than $5\times10^{-4}$ times the line narrowed energy for a thirty pulse window. As is shown in FIG. 5 the ASE is substantially zero when the narrow band pulse is maximum; i.e., in this case when the MO discharge precedes the PA discharge by between 25 and 40 ns. Otherwise, the ASE becomes significant.

As described above, the MO and the PA pulse power circuits can be triggered with a timing accuracy of about 2 ns so with good feedback information regarding the response of the two pulse power circuits, the MO and the PA can be discharged within the range where line narrowed pulse energy is maximum and ASE is insignificant. Therefore, for continuous operation with good feedback control, control of the two systems is relatively easy. However, typical operation of these lasers is burst mode operation as described above. Therefore, the first pulse of a burst is likely to produce bad results because any feedback data will be out of date and temperature changes in the electrical components will likely affect their responses.

One solution is to initiate a test pulse prior to each burst (perhas with the laser shutter closed) so that up-to-date timing data can be obtained. This solution is not desirable for several reasons including the delay associated with closing and opening the shutter.

Figure 6:
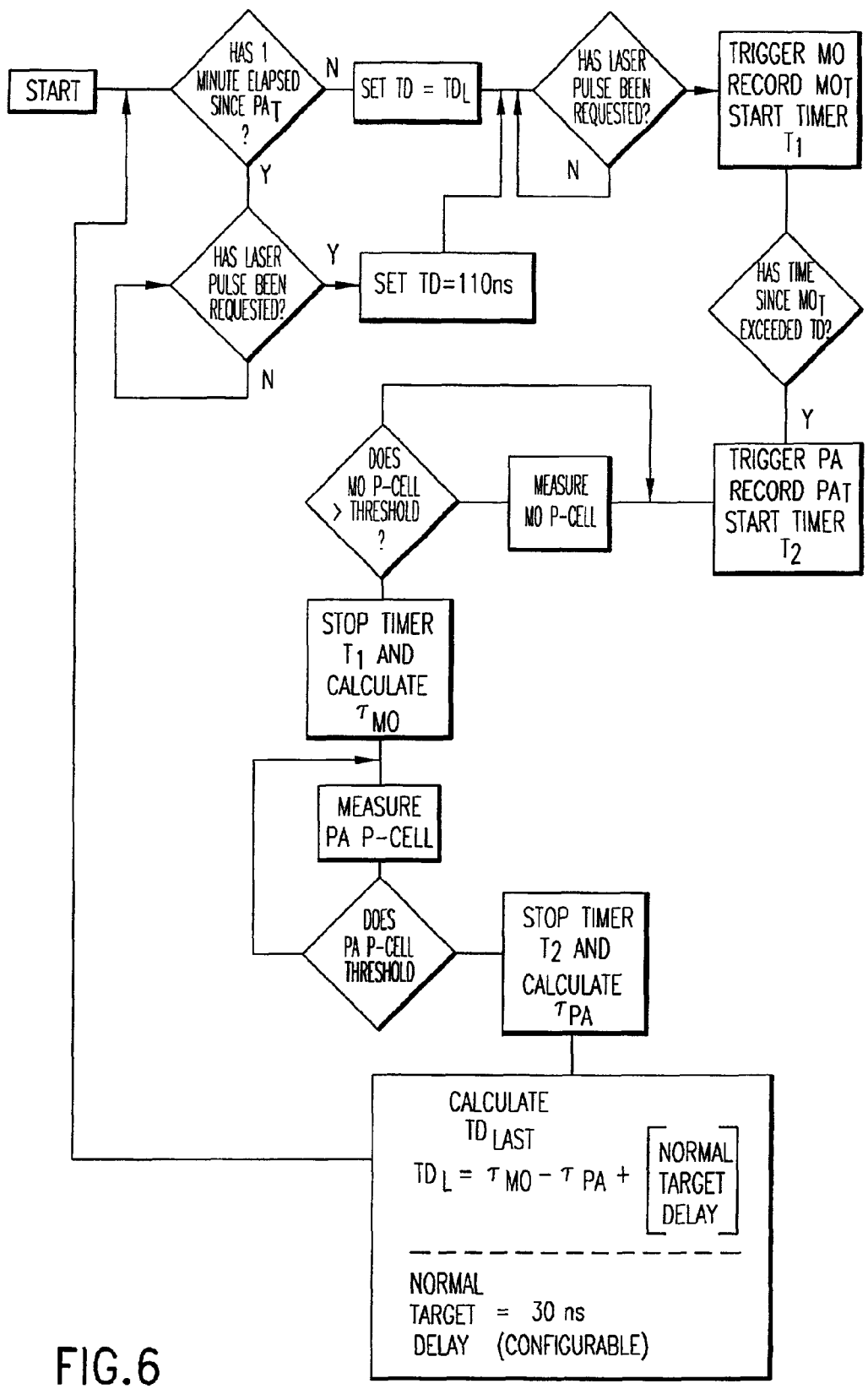
FIGS. 6, 6A, 7 and 7A are flow designs showing processes for producing a no-output first pulse.
Figure 6A:
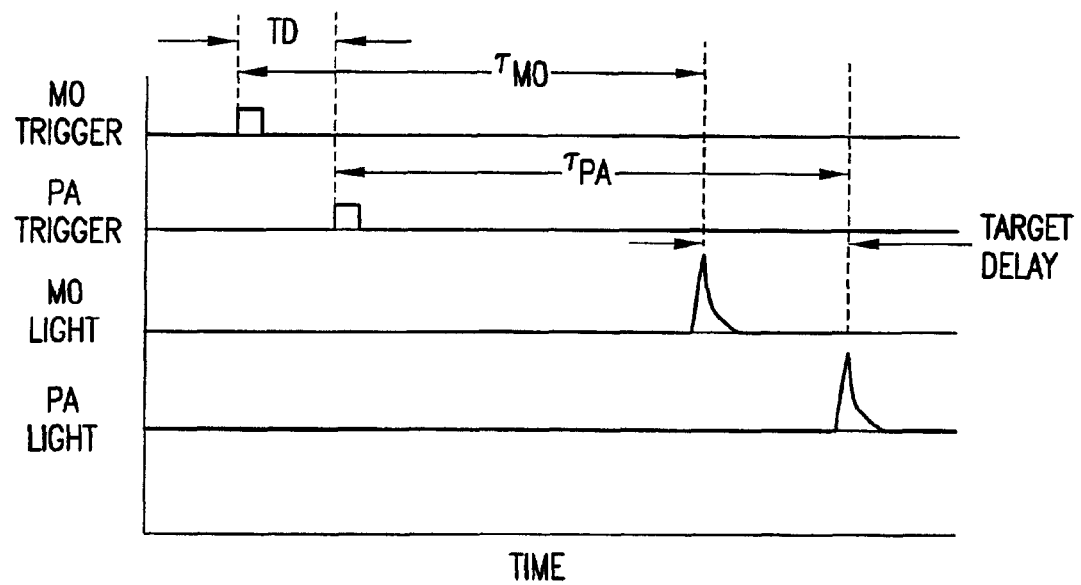
Figure 7:
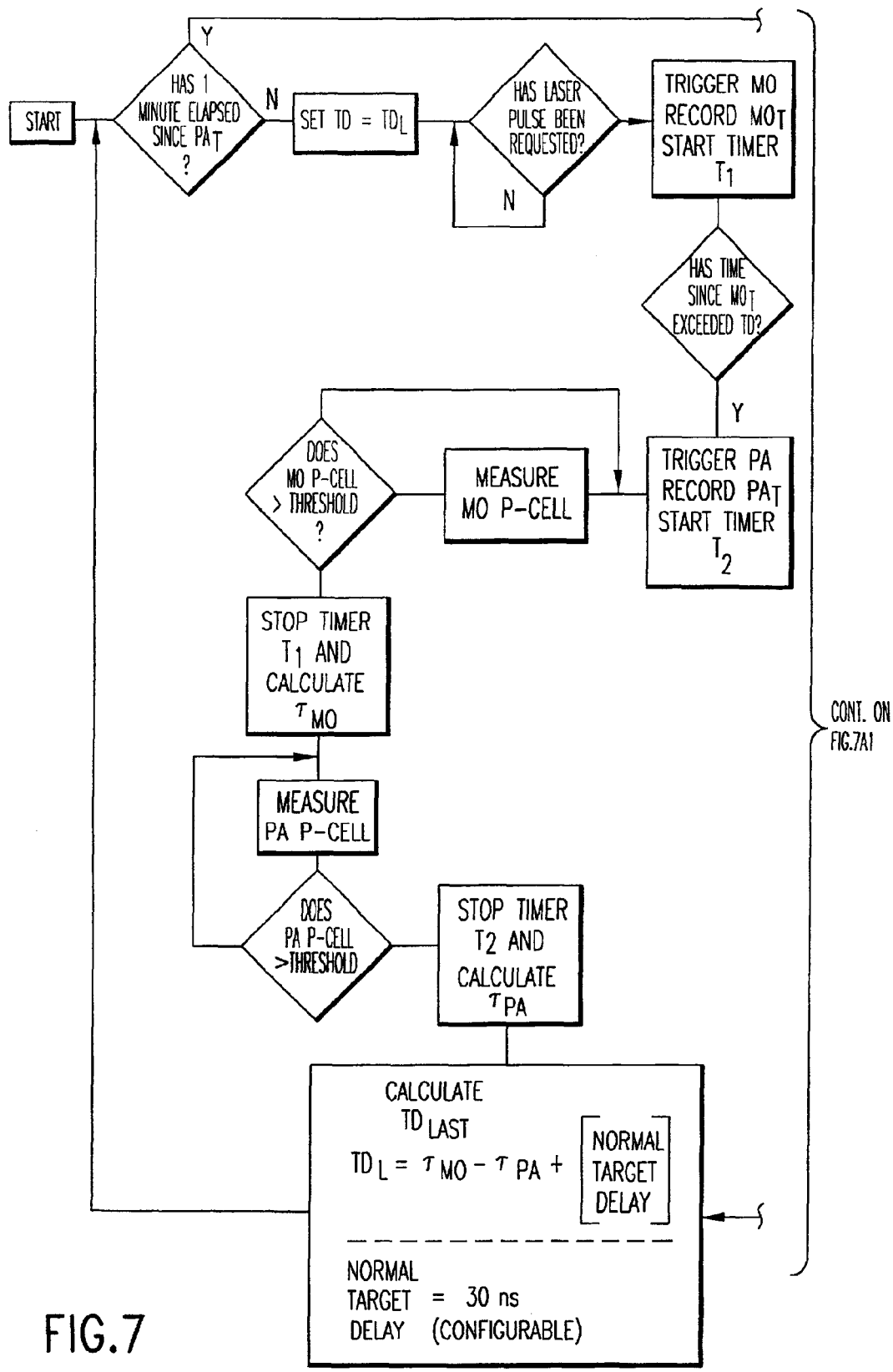
Figure 7A:
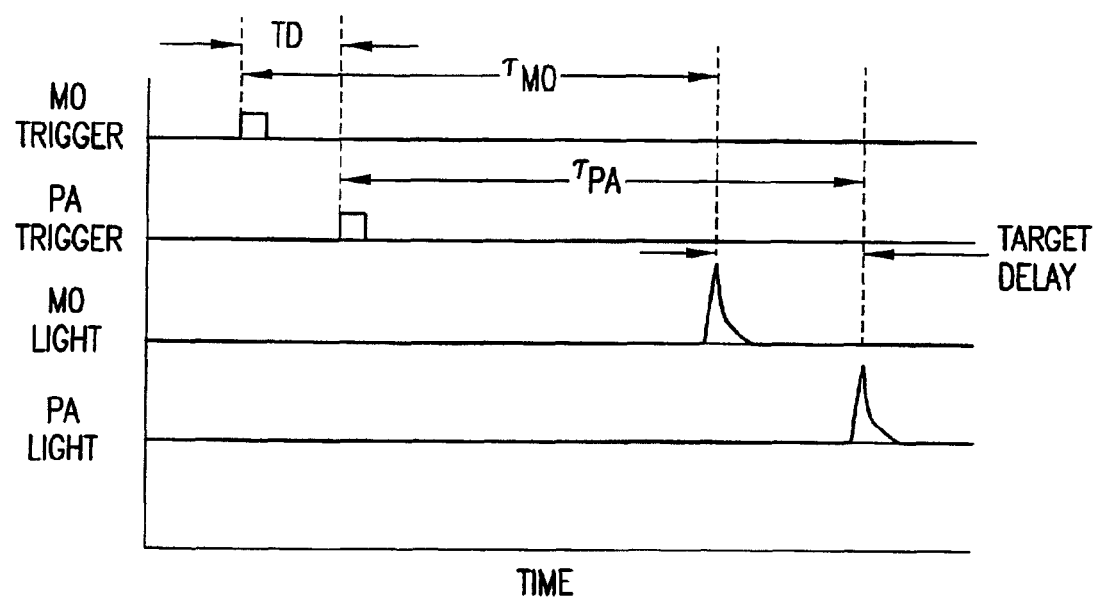

A better solution is the one referred to briefly above in which the two chambers are caused to discharge at relative times chosen so that there can be no amplification of the output of the MO. This means, in the case of the system that is the subject of the FIG. 5 data, that the MO must be discharged later than about 40 ns after the PA is discharged or that the MO must be discharged earlier than 110 ns prior to the discharge of the PA. FIGS. 6 and 7 describe these two jitter control techniques.

In the FIG. 6 technique if more than one minute has elapsed since the previous pulse, the PA is discharged 110 ns after the MO is discharged. Otherwise the PA is discharged 30 ns after the MO is discharged to produce the desired pulse energy. The technique calls for collecting timing data, and feedback corrections are made for any changes in timing between trigger and discharge. The discharge are detected by photocells detecting discharge produced ASE light in both the MO and the PA.

In the FIG. 7 technique if more than one minute has elapsed since the previous pulse, the MO is discharged 40 ns after to the discharge of the PA. As before, timing data is collected and used to assure that discharges subsequent to the first pulse occur when they should to produce maximum narrow band output and minimum ASE.

Thus, the first pules of each burst after more than a one minute idle time produces substantially zero line narrowed output on an extremely small amount of ASE. Applicants estimate that the ASE for pulse window of at least 30 pulse the ASE will be less than $2\times10^{-4}$ of the integrated narrow band energy. Since pulses in this preferred laser are at the rate of 4000 pulses per second, the loss of a single pulse at the beginning of a burst of pulses is not expected to be a problem for the laser users.

Variations

Many modifications could be made to the procedures outline in FIGS. 6 and 7 to achieve similar results. The time values such as the 30 second targets shown of course should be chosen to provide best results. The 1 minute could be as small as a few milliseconds so that the first pulse of each burst is thrown away. In the FIG. 6 situations based on the FIG. 5 data, the 110 ns time period could be shortened to as much as about 70 ns and in the FIG. 7 situation the 40 ns time period could be as short as about 20 ns. The programs could be modified to provide for two or several no output discharges at the start of each burst or at the start of each burst following an extended idle period. Parameters other than the P-cell outputs threshold could be used to determine the times of beginning of discharge. For example, the peaking capacitor voltage could be monitored. The sudden drop in voltage soon after the beginning of discharge could be used as the time of start of discharge.

While the present invention has been described in terms of specific embodiments persons skilled in the art will recognize many modifications could be made within the general scope of the invention. For example, additional data could be collected to provide additional feedback information to possibly improve timing precision. It is known that temperature of the electrical components affect timing so the temperature of the components could be monitored and data collected could be correlated with historical timing data collected as a function of temperature and appropriate corrections could be included in the algorithms shown in FIGS. 6 and 7. Other techniques could be used to determine the timing responses of the pulse power components. For example, the saturable reactors in the pulse power circuits produce much of the timing variations. A test voltage could be applied across there reactors to determine their response and data collected could be used to correct discharge timing. Accordingly, the above disclosure is not intended to be limiting and the scope of the claims should be determined by the appended claims and their legal equivalents.

We claim:

1. A very narrow band two chamber high repetition rate gas discharge laser system with special timing control features, said system comprising:

A) a first laser unit comprising:
  1) a first discharge chamber containing;
    a) a first laser gas
    b) a first pair of elongated spaced apart electrodes defining a first discharge region,
  2) a first fan for producing sufficient gas velocities of said first laser gas in said first discharge region to clear from said first discharge region, following each pulse, substantially all discharge produced ions prior to a next pulse when operating at a repetition rate in the range of 4,000 pulses per second or greater,
  3) a first heat exchanger system capable of removing at least 16 kw of heat energy from said first laser gas,
  4) a line narrowing unit for narrowing spectral bandwidths of light pulses produced in said first discharge chamber,
B) a second laser unit comprising:
  1) a second discharge chamber containing:
    a) a second laser gas,
    b) a second pair of elongated spaced apart electrodes defining a second discharge region
  2) a second fan for producing sufficient gas velocities of said second laser gas in said second discharge region to clear from said second discharge region, following each pulse, substantially all discharge produced ions prior to a next pulse when operating at a repetition rate in the range of 4,000 pulses per second or greater,
  3) a second heat exchanger system capable of removing at least 16 kw of heat energy from said second laser gas,
C) a pulse power system configured to provide electrical pulses to said first pair of electrodes and to said second pair of electrodes sufficient to produce laser pulses at rates of about 4,000 pulses per second with precisely controlled pulse energies in excess of about 5 mJ,
D) a laser beam measurement and control system for measuring pulse energy, wavelength and bandwidth of laser output pulses produced by said two chamber laser system and controlling said laser output pulses in a feedback control arrangement, and
E) a processor programmed with an algorithm providing feedback timing control.

2. A laser system as in claim 1 wherein said first laser unit is configured as a master oscillator and said second laser unit is configured as a power amplifier.

3. A laser system as in claim 2 wherein said laser gas comprises argon, fluoride and neon.

4. A laser system as in claim 2 wherein said laser gas comprises krypton, fluorine and neon.

5. A laser system as in claim 2 wherein said laser gas comprises fluorine and a buffer gas chosen from a group consisting of neon, helium or a mixture of neon and helium.

6. A laser as in claim 1 wherein said first fan and said second fan each are tangential fans and each comprises a shaft driven by two brushless DC motors.

7. A laser as in claim 1 wherein said motors are water cooled motors.

8. A laser as in claim 1 wherein said pulse power power system comprise water cooled electrical components.

9. A laser as in claim 8 wherein at least one of said water cooled components is a component operated at high voltages in excess of 12,000 volts.

10. A laser as in claim 9 wherein said high voltage is isolated from ground using an inductor through which cooling water flows.

11. A laser as in claim 1 wherein said pulse power system comprises a resonant charging system to charge a charging capacitor to a precisely controlled voltage.

12. A laser system as in claim 1 wherein said system is configured to operate either of a KrF laser system, an ArF laser system or an $F_2$ laser system with minor modifications.

13. A laser system as in claim 1 wherein substantially all components are contained in a laser enclosure but said system comprises an AC/DC module physically separate from the enclosure.

14. A laser system as in claim 1 wherein said pulse power system comprises a master oscillator charging capacitor bank and a power amplifier charging capacitor bank and a resonant charger configured to charge both charging capacitor banks in parallel.

15. A laser as in claim 14 wherein said pulse power system comprises a power supply configured to furnish at least 2000 V supply to said resonant charges.

16. A laser as in claim 1 and further comprising a gas control system for controlling $F_2$ concentrations in said first laser gas to control master oscillator beam parameters.

17. A laser as in claim 1 and further comprising a gas control system for controlling laser gas pressure in said first laser gas to control master oscillator beam parameters.

18. A laser as in claim 2 and further comprising a discharge timing controller for triggering discharges in said power amplifier to occur between 20 and 60 ns after discharges in said master oscillator.

19. A laser as in claim 2 and further comprising a discharge controller programmed to cause in some circumstances discharges so timed to avoid any significant output pulse energy.

20. A laser as in claim 19 wherein said controller is programmed to cause discharge, in some circumstances, in said power amplifier at least 20 ns prior to discharge in said master oscillator.

21. A laser as in claim 19 wherein said controller is programmed to cause discharge, in some circumstances, in said power amplifier at least 70 ns after discharge in said master oscillator discharge.

22. A laser as in claim 20 wherein said at least 20 ns is about 40 ns.

23. A laser as in claim 21 wherein said at least 70 ns is about 110 ns.

24. A laser as in claim 1 wherein said laser also comprises P-cells for measuring ASE of discharge in each of said first and second chamber.

25. claim 24 wherein signals from said P-cells wherein said controller is program to use signals from said P-cells to indicate discharges.

26. A laser as in claim 21 wherein said controller is programmed to determine discharge based on measurement of capacitor voltage.

* * * * *

UNITED STATES PATENT AND TRADEMARK OFFICE
CERTIFICATE OF CORRECTION

PATENT NO. : 6,865,210 B2
DATED : March 8, 2005
INVENTOR(S) : Ershov et al.

It is certified that error appears in the above-identified patent and that said Letters Patent is hereby corrected as shown below:

Column 15
Line 49, "fluoride" should be changed to -- fluorine --;
Line 60, delete "power", 2$^{nd}$ occurrence;
Line 61, "comprise" should be changed to -- comprises --.

Column 16,
Line 24, "charges" should be changed to -- charger --;
Lines 54 and 55, should read -- A laser as in Claim 24 wherein said controller is programmed to use signals from said P- cells to --

Signed and Sealed this

Seventeenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,865,210 B2
DATED : March 8, 2005
INVENTOR(S) : Ershov et al.

It is certified that error appears in the above-identified patent and that said Letters Patent is hereby corrected as shown below:

<u>Column 8,</u>
Line 38, please change "Inductors 48, 54 and 64 are" to -- Inductor 64 is a --.

<u>Column 15,</u>
Line 58, "claim 1", should be changed to -- claim 6 --.

Signed and Sealed this

First Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,865,210 B2
APPLICATION NO. : 10/036727
DATED : March 8, 2005
INVENTOR(S) : Ershov et al.

It is certified that error appears in the above-identified patent and that said Letters Patent is hereby corrected as shown below:

Column 15:
Line 61, please change "comprise" to --comprised--

Column 16:
Line 55, please change "program" to --programmed--.

Signed and Sealed this

Fifth Day of February, 2008

JON W. DUDAS
*Director of the United States Patent and Trademark Office*

UNITED STATES PATENT AND TRADEMARK OFFICE
CERTIFICATE OF CORRECTION

PATENT NO. : 6,865,210 B2  
APPLICATION NO. : 10/036727  
DATED : March 8, 2005  
INVENTOR(S) : Ershov et al.

Page 1 of 1

It is certified that error appears in the above-identified patent and that said Letters Patent is hereby corrected as shown below:

<u>Column 15:</u>  
Line 61. please change "comprise" to --comprises--.

<u>Column 16:</u>  
Line 55. please change "program" to --programmed--.

Signed and Sealed this

Nineteenth Day of February, 2008

JON W. DUDAS  
*Director of the United States Patent and Trademark Office*